(12) United States Patent
Honkura et al.

(10) Patent No.: US 11,262,419 B2
(45) Date of Patent: Mar. 1, 2022

(54) ULTRA-SMALL AND HIGH-SENSITIVITY MAGNETIC SENSOR

(71) Applicant: ASAHI INTECC CO., LTD., Seto (JP)

(72) Inventors: Yoshinobu Honkura, Chita-gun (JP); Shinpei Honkura, Chita-gun (JP); Kazue Kudo, Chita-gun (JP); Junichi Tanabe, Chita-gun (JP); Eiki Kikuchi, Chita-gun (JP)

(73) Assignee: ASAHI INTECC CO., LTD., Seto (JP)

( * ) Notice: Subject to any disclaimer, the term of this patent is extended or adjusted under 35 U.S.C. 154(b) by 255 days.

(21) Appl. No.: 16/720,016

(22) Filed: Dec. 19, 2019

(65) Prior Publication Data

US 2020/0124686 A1 Apr. 23, 2020

Related U.S. Application Data

(63) Continuation of application No. PCT/JP2018/019705, filed on May 22, 2018.

(30) Foreign Application Priority Data

Jul. 21, 2017 (JP) .............................. JP2017-141410

(51) Int. Cl.
*G01R 33/028* (2006.01)
*H01L 27/22* (2006.01)
*H01L 43/12* (2006.01)

(52) U.S. Cl.
CPC .......... *G01R 33/0283* (2013.01); *H01L 27/22* (2013.01); *H01L 43/12* (2013.01)

(58) Field of Classification Search
CPC .. G01R 33/0283; G01R 33/063; G01R 33/06; H01L 27/22; H01L 43/12
See application file for complete search history.

(56) References Cited

U.S. PATENT DOCUMENTS

| | | | |
|---|---|---|---|
| 9,227,840 B2* | 1/2016 | Su | G01P 15/00 |
| 9,577,185 B1 | 2/2017 | Lee et al. | |
| 10,948,553 B2* | 3/2021 | Huber Lindenberger | G01D 5/142 |
| 2003/0155913 A1* | 8/2003 | Honkura | G01R 33/02 324/249 |
| 2006/0202291 A1 | 9/2006 | Kolb et al. | |
| 2009/0212391 A1* | 8/2009 | Carobolante | H01L 28/10 257/531 |

(Continued)

FOREIGN PATENT DOCUMENTS

| | | |
|---|---|---|
| EP | 2813859 A1 | 12/2014 |
| JP | 2009-503443 A | 1/2009 |

(Continued)

*Primary Examiner* — Alvaro E Fortich
*Assistant Examiner* — Zannatul Ferdous
(74) *Attorney, Agent, or Firm* — Xsensus LLP

(57) ABSTRACT

A magnetic sensor comprising: an application specific integrated circuit (ASIC); an insulating protective film formed on a surface of the ASIC; a substrate film formed on the insulating protective film; and a magnetic field detection element formed on the substrate film, the magnetic field detection element including two magnetic wires on the substrate film, a detection coil surrounding the two magnetic wires, two electrodes coupled to the two magnetic wires for wire energization, and two electrodes coupled to the coil for coil voltage detection.

14 Claims, 5 Drawing Sheets

(56) References Cited

U.S. PATENT DOCUMENTS

| | | | |
|---|---|---|---|
| 2012/0013332 A1* | 1/2012 | Honkura | G01R 33/0206 |
| | | | 324/244 |
| 2014/0247042 A1 | 9/2014 | Lei et al. | |
| 2016/0238673 A1 | 8/2016 | Honkura | |

FOREIGN PATENT DOCUMENTS

| | | |
|---|---|---|
| JP | 4529783 B | 6/2010 |
| JP | 2014-153309 A | 8/2014 |
| JP | 5839527 B1 | 1/2016 |

* cited by examiner

ULTRA-SMALL AND HIGH-SENSITIVITY MAGNETIC SENSOR

CROSS REFERENCES TO RELATED APPLICATIONS

This application is a bypass continuation of PCT filing PCT/JP2018/019705, filed May 22, 2018, which claims priority to Japanese Patent Application 2017-141410, filed Jul. 21, 2017, the entire contents of each are incorporated herein by reference.

TECHNICAL FIELD

The present disclosure relates to a technology of achieving ultra-small size and thickness of a GSR (GHz-Spin-Rotation) sensor by integrally forming a GSR element and an associated application specific integrated circuit (hereinafter, referred to as an ASIC).

Here, the GSR sensor refers to a high-sensitivity micro magnetic sensor based on the GHz Spin Rotation effect.

BACKGROUND

High-sensitivity micro magnetic sensors include horizontal type FG (Fluxgate) sensors, vertical type FG sensors, hall sensors, GMR (Giant-Magneto-Resistance) sensors, TMR (Tunnel-Magneto-Resistance) sensors, MI (Magneto-Impedance) sensors, GSR sensors, high frequency carrier sensors, and the like. These sensors have been widely adopted in smartphones, automobiles, medical care, robots, and the like. Among them, the GSR sensors (Patent Literature 1) are excellent in sensitivity and size, and attract the most attention.

Recently, studies (Patent Literatures 2 and 3) have been advanced for mounting a magnetic sensor in an in vivo motion device such as a catheter and obtaining position and orientation to achieve remote control treatment utilizing the measurement values.

For mounting in an in vivo motion device, a sensor size is preferably as small as possible. However, detection sensitivity decreases in inverse proportion to the sensor size, and therefore, downsizing while maintaining required detection sensitivity is difficult. For example, for a case of mounting in a catheter, development of a magnetic sensor having ultra-small size of width of about 0.1 mm, length of about 0.3 mm, and thickness of about 0.05 mm, and excellent ultra-high sensitivity in magnetic field detection ability of about 0.1 mG to 1 mG is desirable.

CITATION LIST

Patent Literature

Patent Literature 1: Japanese Patent No. 583975
Patent Literature 2: Japanese Patent Application Publication No. 2015-134166
Patent Literature 3: Japanese Patent Application Publication No. 2017-12840
Patent Literature 4: Japanese Patent Application Publication No. 2014-153309
Patent Literature 5: Japanese Patent Application Publication No. 2014-042055

SUMMARY

The present application describes a magnetic sensor comprising: an application specific integrated circuit (ASIC); an insulating protective film formed on a surface of the ASIC; a substrate film formed on the insulating protective film; and a magnetic field detection element formed on the substrate film, the magnetic field detection element including two magnetic wires on the substrate film, a detection coil surrounding the two magnetic wires, two electrodes coupled to the two magnetic wires for wire energization, and two electrodes coupled to the coil for coil voltage detection.

DETAILED DESCRIPTION

Figure 1:
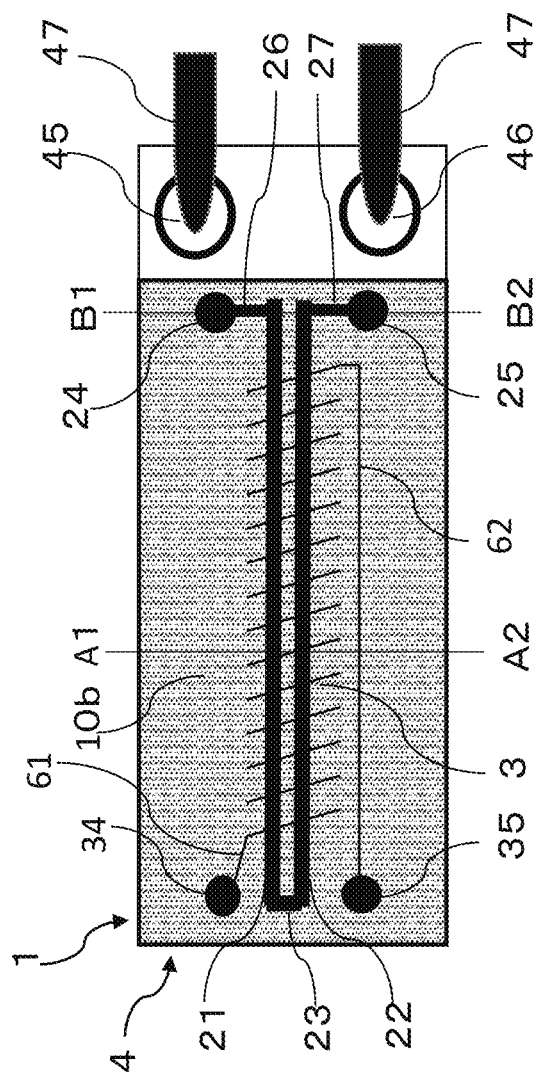
FIG. 1 illustrates a plan view of a GSR sensor and a GSR element according to an embodiment.

A number of methods have been disclosed for reducing the size of GSR sensors, including downsizing GSR elements, downsizing associated ASICs, and combining the GSR elements and the ASICs on a single substrate (Patent Literature 4). However, all of the prior art have limitations, particularly with respect to thickness reduction, since a GSR element and an ASIC are typically manufactured as two separate components and then combined onto a substrate (Patent Literatures 4 and 5).

In some embodiments, in combining an ASIC and a GSR element, the thickness may be reduced by forming a film serving as a substrate of a GSR element on an insulating protective film of an ASIC main body, attaching a groove in which a magnetic wire is arrayed onto the substrate film, and integrally forming the GSR element including the magnetic wire and a detection coil surrounding the magnetic wire.

In some embodiments, an oxide such as $SiO_2$ or $Al_2O_3$, or a nitride such as SiN may be used as a substrate film of the GSR element. When such a substrate film is used, in the case of forming a GSR element directly on an ASIC surface, there may be processes of forming a micro groove such as $CF_4$ gas plasma processing, resist heating cure processing, or developing processing using acidity or alkalinity that are included in the manufacturing process of the GSR element that may damage the insulating protective film of the ASIC surface, causing function reduction of the ASIC circuit under the GSR element substrate due to the damage.

In some embodiments, a single structure may be used, in which the insulating protective film is formed to be thick, and the element is formed on the insulating protective film.

In some embodiments, the area of the entire GSR element may be reduced by adopting through-hole type connections for passing through the substrate film and the insulating protective film for electrical connection of the ASIC and the GSR element and making the size of an electrode small.

In embodiments of the present disclosure, a GSR sensor may be made thin and ultra-small.

An ultra-small and high-sensitive magnetic sensor in some embodiments of the present disclosure may include: an ASIC; an insulating protective film formed on a wiring plain surface of the ASIC; a substrate film formed on the protective film; and a magnetic field detection element formed on the substrate film, in which the magnetic field detection element may include a magnetic wire, a detection coil surrounding the magnetic wire, and an electrode on the substrate film.

The magnetic wire may have conductivity and an anisotropic magnetic field of about 20 G or smaller, and may have a two-phase magnetic domain structure of a surface magnetic domain having spin alignment in a circumferential direction, and a central core magnetic domain having spin alignment in an axial direction. The detection coil may have a coil pitch of about 10 µm or smaller.

The electrode may be directly connected by a through hole type to an element coupling electrode of the ASIC by passing through the substrate film and the insulating protective film.

According to embodiments of the present disclosure, a film having a thickness capable of functioning as a substrate of a magnetic field detection element may be formed on an insulating protective film of an ASIC surface, and the film may be used as a substrate. A groove may be formed on the substrate film, and a magnetic wire may be arrayed in the groove to create a magnetic field detection element. That is, a sensor including the magnetic field detection element integrally formed with the ASIC may be made thin and ultra-small size thereof can be achieved.

The ASIC of an ultra-small and high-sensitivity magnetic sensor in embodiments of the present disclosure may include: circuitry configured to produce a pulse current of a frequency in the range of about 0.2 GHz to about 4.0 GHz to flow in a magnetic wire of the magnetic field detection element; circuitry configured to detect a coil voltage generated when the pulse current flows in the magnetic wire; and circuitry configured to convert the coil voltage into an electric signal proportional to the magnitude of an external magnetic field H. Note that the high sensitivity may be achieved by causing the pulse current in the range of about 0.2 GHz to about 4.0 GHz to flow.

The thickness of the substrate film of the ultra-small and high-sensitivity magnetic sensor in embodiments of the present disclosure may be in the range of about 1 µm to about 20 µm.

According to embodiments of the present disclosure, the substrate film may be required to have the thickness such that a groove accommodating the magnetic wire can be attached or embedded. In some embodiments, the diameter of the magnetic wire may be in the range of about 1 µm to about 10 µm. When the substrate film is too thick, a problem arises in adhesiveness with the insulating protective film. Accordingly, the thickness of the substrate film is preferably in a range of about 1 µm to about 20 µm. When enough thickness of the insulating protective film for having a function as a substrate is secured, a single layer structure in which the insulating protective film also serves as a substrate film can be adopted.

In the ultra-small and high-sensitivity magnetic sensor according to some embodiments of the present disclosure, in the magnetic field detection element, a groove with a depth in a range of about 1 µm to about 10 µm from the upper surface of the substrate film may be formed, and a part or all of the detection coil may be embedded.

Figure 2:
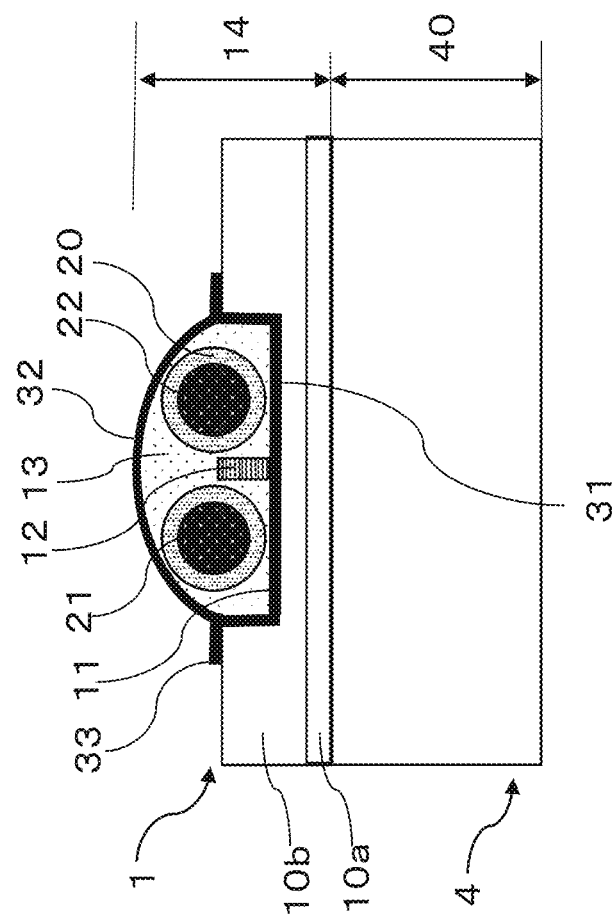
FIG. 2 illustrates a section view of a GSR sensor element along line A1-A2 of FIG. 1.
Figure 3:
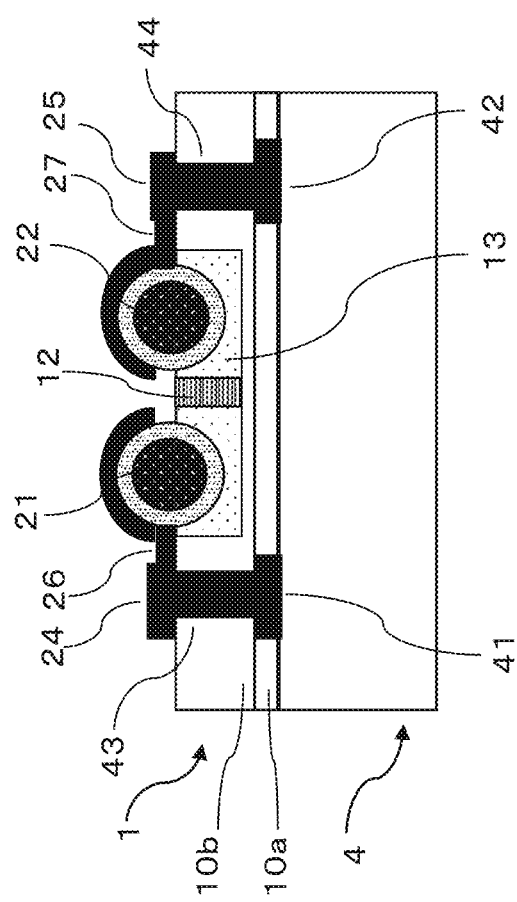
FIG. 3 illustrates a section view of a GSR sensor element along line B1-B2 of FIG. 1.

Embodiments of the present disclosure will be described in detail below with reference to FIG. 1 showing a plan view of a GSR sensor and a GSR sensor element (hereinafter, referred to as an element), FIG. 2 showing a cross-sectional view taken along the line A1-A2, and FIG. 3 showing a cross-sectional view taken along the line B1-B2 of the plan view.

In some embodiments of the present disclosure there may be two magnetic wires, and two layers of the insulating protective film and the substrate film.

The ultra-small and high-sensitivity magnetic sensor (hereinafter, referred to as a sensor) of the present disclosure may include: a GSR sensor element 1 (hereinafter, referred to as an element); an ASIC 4; and electrodes (45 and 46) for external wiring from the ASIC 4.

<Sensor>

In some embodiments, the element 1 included in the sensor may include: two magnetic wires 21 and 22 on a substrate film 10b formed on an insulating protective film 10a of the ASIC 4; a coil 3 surrounding the magnetic wires; two electrodes 24 and 25 for energizing the two magnetic wires 21 and 22; two electrodes 34 and 35 for coil 3 voltage detection; connection parts 26 and 27 between the two magnetic wires 21 and 22 and the two electrodes 24 and 25; connection parts 61 and 62 between the coil 3 and electrodes 34 and 35; two through-hole type connections 43 and 44 from the two electrodes 24 and 25 on the element side to associated wire electrodes 41 and 42 on the ASIC side; and two through-hole type connections (not shown) between the two coil electrodes 34 and 35 on the element side and associated coil electrodes on the ASIC side (not shown).

In some embodiments, the element 1 may also include a wire coupling part 23 that causes a pulse current to flow in opposite directions in the two magnetic wires 21 and 22.

In some embodiments, the ASIC 4 may include an electronic circuit (FIG. 4) that connects with each of two coil electrodes 34 and 35 and each of the two wire electrodes 24 and 25 in element 1 by the through-hole type connections discussed above, and when a pulse current flows in the element 1, a coil voltage generated in the detection coil is detected, and the coil voltage is converted to an external magnetic field. In the ASIC, electrodes 45 and 46 for external wiring are arranged.

Here, a method of determining the external magnetic field from the detected coil voltage in the GSR sensor will be described.

An external magnetic field H and a coil voltage Vs are represented by the mathematical relationship as the formula (1) below, and the coil voltage is converted to the external magnetic field H using the formula.

$$Vs = V_0 \cdot 2L \cdot \pi D \cdot p \cdot Nc \cdot f \sin(\pi H/2Hm) \quad (1)$$

Here, Vs represents a coil output voltage, $V_0$ represents a proportional constant, L represents a wire length, D represents a wire diameter, p represents a skin depth of a pulse current, Nc represents the number of turns of a coil, f represents a pulse frequency, and Hm is an external magnetic field strength when the coil output voltage is the maximum value.

<Structure of Element>

The structure of the element 1 is illustrated in FIGS. 1 to 3, according to some embodiment of the present disclosure.

The substrate film 10b of element 1, in some embodiments, may have a width in the range from about 0.07 mm to about 0.4 mm, a length in the range from about 0.25 mm to about 1 mm, and a thickness in the range from about 10 µm to 15 µm. Accordingly, if, in some embodiments, the thickness of the ASIC 4 is in the range from about 30 µm to about 100 µm, the thickness of the entire sensor is in the range from about 40 µm to about 115 µm.

In the central portion of element 1, in some embodiments, a groove 11 having a width in the range from about 20 µm to about 60 µm and a depth in the range from about 1 µm to about 10 µm may be formed in the substrate film 10b so that the two magnetic wires 21 and 22 can be arrayed and arranged in parallel at least partially embedded in the groove 11. The two magnetic wires 21 and 22 may be arranged close to one another, and the space between the two magnetic wires 21 and 22 may be in the range from about 1 μm to about 10 μm. The magnetic wire 21 and the magnetic wire 22 may be physically isolated by an insulating material, and the isolating is preferably performed by an insulating separation wall 12, for example.

<Magnetic Wire>

In some embodiments, the two magnetic wires 21 and 22 may have a diameter in the range from about 1 μm to about 10 μm and be made of a CoFeSiB alloy. The periphery of the two magnetic wires 21 and 22 may preferably be covered by an insulating material, for example, an insulating glass material. The length of the two magnetic wires 21 and 22 may be in the range from about 0.07 mm to about 1 mm.

The anisotropic magnetic field of the two magnetic wires 21 and 22 may be about 20 G or less, and the two magnetic wires 21 and 22 may have a two-phase magnetic domain structure of a surface magnetic domain having spin alignment in a circumferential direction, and a central core magnetic domain having spin alignment in an axial direction.

<Coil>

In some embodiments, the number of turns of the coil 3 may be in the range of about 6 to about 180, and the coil pitch of the coil 3 may be in the range of about 0.2 μm to about 10 μm. The space between the coil 3 and each of the two magnetic wires 21 and 22 may be in the range from about 0.2 μm to about 3 μm. The average inner diameter of the coil may be in the range from about 2 μm to about 35 μm.

<Manufacturing Method of Element>

In some embodiments, the thickness from the ASIC surface to the top of element 1 may be made to be about 20 μm or smaller by forming the substrate film 10b on the insulating protective film 10a on the surface of the ASIC, forming a groove of depth in the range of about 1 μm to about 10 μm on the substrate film 10b, and forming element 1 such that a part or all of the coil is formed along the groove surface. By forming the thickness of the ASIC to be about 30 μm, the thickness of the entire sensor can be made to be about 50 μm.

In some embodiments, the element 1 may be constructed by forming the substrate film 10b on the insulating protective film 10a of the upper surface of the ASIC. In this embodiment, a two-layer film of the insulating protective film and the substrate film is formed. In other embodiments, the film may be a one-layer film such that the thickness is enough for the insulating protective film having a function as a substrate. As an example of embodiments using a two-layer film, a SiO$_2$ (silicon dioxide) film having the thickness in the range of about 0.5 μm to about 2 μm is formed on the ASIC surface by a vacuum deposition method or the like, and a SiN (silicon nitride) film having the thickness in the range of about 1 μm to about 10 μm is further formed on the upper surface of the SiO$_2$ film. A groove having the depth in the range of about 1 μm to about 10 μm is formed in the SiN film, and an element is formed such that a part or all of the coil is formed along the groove surface.

In some embodiments, electrode wiring may be fabricated on a lower coil 31 and the substrate film surface along the groove 11 formed in the substrate film 10b. Thereafter, an insulating separation wall 12 may be formed in the central portion of the groove 11 to form a two-groove shape, and two magnetic wires 21 and 22, covered with glass, may be arrayed and arranged in the groove shapes.

In some embodiments, an insulating resist coating may be deposited on the entire surface of the substrate film. In this way, the magnetic wires 21 and 22 are fixed into the groove 11. The insulating resist coating may be made thin along the upper portion of the magnetic wires 21 and 22. An upper coil 32 may then be formed thereon by a photolithography technology.

Here, as the characteristics of the substrate film and the insulating protective film, resistance in the processes such as micro groove processing, CF$_4$ gas plasma processing, resist heating cure processing, development processing using acidity or alkalinity, and the like in the manufacturing process of the element 1, and prevention of the function reduction of the ASIC circuit are required. Accordingly, as long as the characteristics required here are achieved, the material of the substrate film is not limited to oxide or nitride.

Note that in embodiments where the magnetic wires 21 and 22 are not covered with glass, an insulating material coating may be performed in prior to the two magnetic wires 21 and 22 being arrayed and arranged in the groove shapes, so that the lower coil 31 does not electrically contact with the magnetic wires 21 and 22.

In some embodiments, in the manufacturing of the coil, the lower coil 31 having a concave shape may be formed along the groove surface of the groove 11 and both sides of the groove 11 formed on the substrate film 10b. The upper coil 32 having a convex shape may be electrically jointed to the lower coil 31 via an interconnection part 33 so that a helical shape coil 3 may be formed.

In some embodiments, end portions of the two magnetic wires 21 and 22 are made to be able to perform electrical connection by metal deposition by removing the glass of the insulating coating material.

<Wiring Structures of Magnetic Wire and Coil>

Wiring structures of the two magnetic wires 21 and 22 and the coil 3 will be described with reference to FIG. 1.

In some embodiments, in the wiring structure of the two magnetic wires 21 and 22, a wire input electrode (+) 24 may be connected to the upper magnetic wire 21 which may be connected to the lower magnetic wire 22 via the wire coupling part 23. The lower magnetic wire 22 may be connected to a wire output electrode (−) 25.

Due to the wire coupling part 23, a pulse current may flow from right to left in magnetic wire 21, and the pulse current may flow from left to right in the magnetic wire 22 (opposite direction as that in the magnetic wire 21).

In some embodiments, in the wiring structure of the coil 3, a coil output electrode (+) 34 may be connected to an upper end portion of the coil 3, and a coil ground electrode (−) 35 may be connected to a lower end portion of the coil 3.

Referring now to FIG. 3, in some embodiments, the electrodes 24 and 25 on the element side and the corresponding electrodes 41 and 42 on the ASIC side may be electrically connected with each other via through-hole connections 43 and 44 passing through the insulating protective film 10a and the substrate film 10b as shown in the example of FIG. 3.

Similarly, the coil electrodes on the element side and the coil electrodes on the ASIC side are connected with each other via through-hole connections (not shown) passing through the insulating protective film 10a and the substrate film 10b.

<Electronic Circuit>

Figure 4:
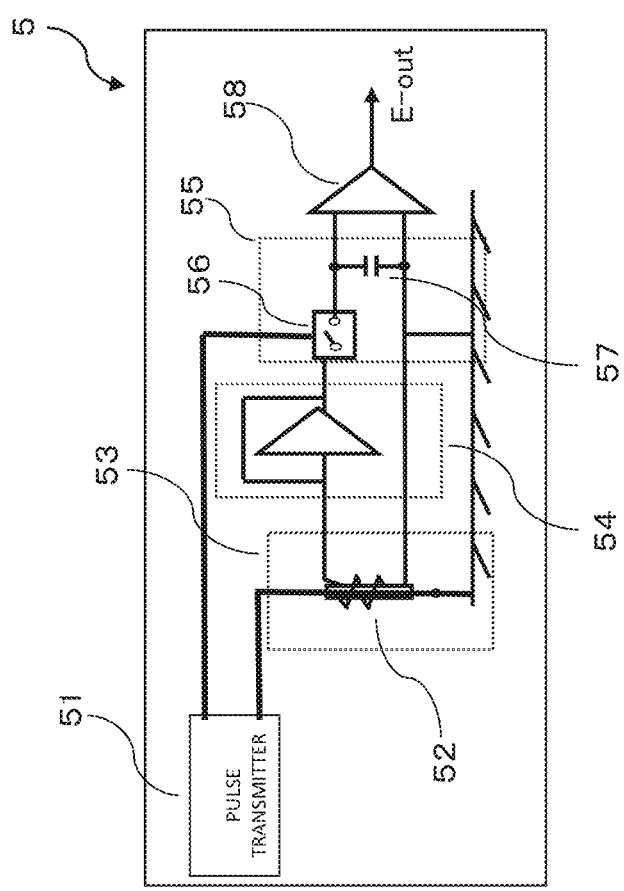
FIG. 4 illustrates an electronic circuit diagram according to an embodiment.

Referring now to FIG. 4, in some embodiments, the electronic circuit 5 provides drive and receive functions for a GSR element. Electronic circuit 5 may include a pulse transmitting circuit 51 that may send a pulse current to the two magnetic wires 21 and 22 (FIG. 1) in element 1 (shown in simplified form as 52 in FIG. 4), an input circuit 53 that receives a coil voltage, a pulse-responsive buffer circuit 54, a sample and hold circuit 55 including an electronic switch 56 that detects the peak voltage of the rising pulse output waveform of the coil and a capacitor 57 having a capacitance in the range of about 4 pF to about 100 pF that holds the peak voltage, and a programming amplifier 58. For optimal high-speed performance of the sample and hold circuit 55 and electronic switch 56, the capacitance of capacitor 57 may preferably be in the range from about 4 pF to about 8 pF. The output of programming amplifier 58 may be transferred to an external signal processing device, such as an analog-to-digital (A/D) converter (not shown). In some embodiments, the A/D converter may have a resolution from about 14 bits to about 16 bits.

Figure 5:
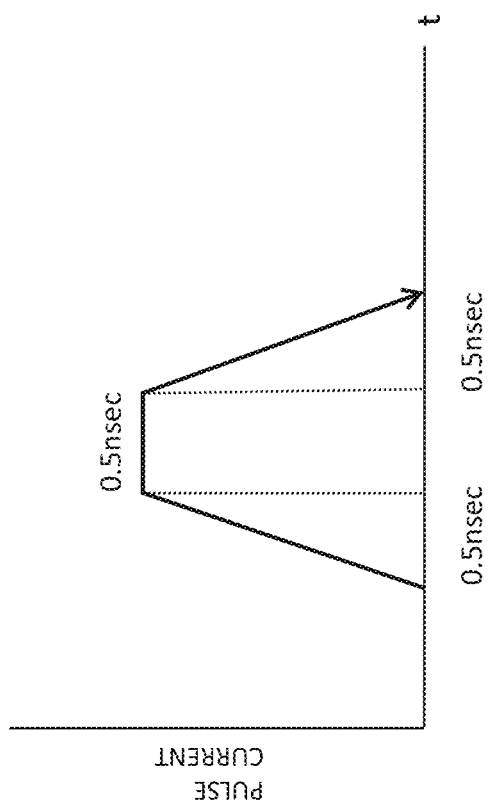
FIG. 5 illustrates, for some embodiments, the relationship between energizing time and a pulse current at the time of energizing of an element with a pulse current.

In some embodiments, the frequency of the pulse current may be in the range of about 0.2 GHz to about 4 GHz, the pulse current may be in the range of about 50 mA to about 200 mA, and the pulse energizing time may be about 2 ns or less. FIG. 5 illustrates, for some embodiments, the relationship between energizing time and a pulse current at the time of energizing of an element with a pulse current. In the example of FIG. 5, the pulse current rises in about 0.5 ns, remains in the application state for a predetermined pulse time of about 0.5 ns, and falls in about 0.5 ns.

Referring again to FIG. 4, in some embodiments, the coil output received by input circuit 53 and pulse-responsive buffer circuit 54 in electronic circuit 5, may represent a magnetic field measurement range of about 3 G to about 100 G by sine wave output, and the sensitivity thereof may be approximately 50 mV/G to 3 V/G. The linearity of the coil output may be equal to or less than 0.3%.

Example

An example of an embodiment of the present disclosure will be described with reference to FIG. 1 showing a plan view of a GSR sensor and a GSR element according to an example embodiment, FIG. 2 showing a cross-sectional view taken along the line A1-A2 of the plan view, and FIG. 3 showing a cross-sectional view taken along the line B1-B2 of the plan view.

Here, the configuration of the GSR sensor and the configuration of the element, and the electronic circuit are an example according to one or more embodiments described above.

In the example embodiment, the width of element 1 is 0.10 mm and the length of element 1 is 0.40 mm. A thickness 40 of the ASIC 4 is 50 μm, a thickness 14 of the insulating protective film 10a and the substrate film 10b is 8 μm, the thickness of the convex portion of element 1 is 2 μm, and the thickness of the entire GSR sensor obtained by summing these is 60 μm.

In the example embodiment, in the central portion of element 1, a groove 11 has a width of 20 μm and a depth of 3 μm and is formed in the substrate film 10b such that the two magnetic wires 21 and 22 can be arrayed and arranged in parallel. The two magnetic wires 21 and 22 have a space between them of 3 μm, and the magnetic wires 21 and 22 are isolated by an insulating separation wall 12 having a thickness of 3 μm.

In the example embodiment, the two magnetic wires 21 and 22 are made of a CoFeSiB amorphous alloy and have a diameter of 5 μm. The periphery of the two magnetic wires 21 and 22 is coated with an insulating glass. The length of each of the two magnetic wires 21 and 22 is 0.40 mm.

In the example embodiment, the anisotropic magnetic field of the two magnetic wires 21 and 22 is 15 G, and the two magnetic wires 21 and 22 have a two-phase magnetic domain structure of a surface magnetic domain having spin alignment in a circumferential direction, and a central core magnetic domain having spin alignment in an axial direction.

In the example embodiment, the number of turns of the coil 3 is 100, and the pitch of the coil 3 is 3 μm. The space between the coil 3 and the two magnetic wires 21 and 22 is 2 μm, and the average inner diameter of the coil is 8 μm.

In the example embodiment, the substrate film 10b has a thickness of 7 μm and is formed on the insulating protective film 10a of the upper surface of the ASIC.

In the example embodiment, the capacitance of the capacitor 57 of the electronic circuit 5 is 6 pF. The frequency of the pulse current is 0.4 GHz, the intensity of the pulse current is 50 mA, and the pulse time is 1 nsec. The timing of the peak voltage of the rising pulse is detected. The electronic switch 56 has an on-off (opening and closing) rate of 0.1 ns. The A/D conversion (not shown) has a resolution of 16 bits.

In the example embodiment, the coil output is in the measurement range of 3 G, and the sensitivity thereof is 1000 mV/G. The linearity is equal to or less than 0.3%.

INDUSTRIAL APPLICABILITY

In some embodiments of the present disclosure, an element and an ASIC are integrated to achieve the ultra-small size of a GSR sensor, and such embodiments may be expected to be used in application in which the ultra-small size and high performance are required such as an in vivo motion device.

Embodiments of the present disclosure may be applicable to a small size and ultra-high sensitivity GSR sensor for an automobile, a wearable computer, or the like.

REFERENCE NUMBER LIST

1: GSR sensor element
10a: Insulating protective film
10b: Substrate film
11: Groove
12: Insulating separation wall
13: Insulating resist
14: Element thickness
21: First magnetic wire
22: Second magnetic wire
23: Wire coupling part
24: Wire input electrode (+)
25: Wire output electrode (−)
26: Wire electrode connection part (+)
27: Wire electrode connection part (−)
3: Coil
31: Lower coil
32: Upper coil
33: Interconnection part
34: Coil output electrode (+)
35: Coil ground electrode (−)
4: ASIC
40: ASIC thickness
41: ASIC side wire electrode (+)
42: ASIC side wire electrode (−)

43: Through-hole type connection (+)
44: Through-hole type connection (-)
45: External wiring electrode
46: External wiring earth electrode
47: External wiring
5: Electronic circuit
51: Pulse transmitting circuit (pulse transmitter)
52: Element
53: Input circuit
54: Buffer circuit
55: Sample hold circuit
56: Electronic switch
57: Capacitor
58: Amplifier

The invention claimed is:

1. A magnetic sensor comprising:
an application specific integrated circuit (ASIC);
an insulating protective film formed on a surface of the ASIC;
a substrate film formed on the insulating protective film; and
a magnetic field detection element formed on the substrate film, the magnetic field detection element including two magnetic wires on the substrate film, a detection coil surrounding the two magnetic wires, two electrodes coupled to the two magnetic wires for wire energization, and two electrodes coupled to the coil for coil voltage detection;
wherein the two magnetic wires have a two-phase magnetic domain structure of a surface magnetic domain having spin alignment in a circumferential direction, and a central core magnetic domain having spin alignment in an axial direction;
wherein the two electrodes coupled to the two magnetic wires and two electrodes coupled to the coil are electrically connected to associated element coupling electrodes of the ASIC by through-hole type connections through the substrate film and the insulating protective film;
wherein the ASIC comprises circuitry configured to:
generate a pulse current of a frequency in the range of 0.2 Giga Herz (GHz) to 4.0 Giga Herz (GHz) and transmit the pulse current to the two magnetic wires of the magnetic field detection element;
detect the coil voltage generated in the detection coil of the magnetic field detection element when the pulse current flows in the two magnetic wires;
convert the coil voltage into an electric signal proportional to the magnitude of an external magnetic field H.

2. The magnetic sensor of claim 1, wherein the two magnetic wires have conductivity and an anisotropic magnetic field of 20 Giga (G) or smaller.

3. The magnetic sensor of claim 1, wherein the detection coil has a coil pitch of 10 micro meter (μm) or smaller.

4. The magnetic sensor of claim 1, wherein the substrate film has a thickness in the range of 1 micro meter (μm) to 20 micro meter (μm).

5. The magnetic sensor of claim 1, wherein the magnetic field detection element has a groove with a depth in the range of 1 micro meter (μm) to 10 micro meter (μm) formed on an upper surface of the substrate film, and wherein at least a portion of the detection coil is embedded in the groove.

6. A method of fabricating a magnetic sensor comprising:
forming an insulating protective film on a surface of an application specific integrated circuit (ASIC);
forming a substrate film on the insulating protective film;
forming a groove in the substrate film;
forming a lower coil at least partially in the groove;
arranging two magnetic wires over the lower coil;
forming an upper coil over the two magnetic wires;
forming an interconnection on the substrate film that provides electrical coupling between the lower coil and the upper coil;
forming two electrodes electrically coupled to the two magnetic wires for wire energization;
forming two electrodes electrically coupled to the coil for coil voltage detection; and
forming through-hole connections to electrically connect the two electrodes coupled to the two magnetic wires and the two electrodes coupled to the coil to associated electrodes on the ASIC;
wherein the two magnetic wires have a two-phase magnetic domain structure of a surface magnetic domain having spin alignment in a circumferential direction, and a central core magnetic domain having spin alignment in an axial direction;
wherein the ASIC comprises circuitry configured to:
generate a pulse current at a frequency in the range of 0.2 Giga Herz (GHz) to 4.0 Giga Herz (GHz) and transmit the pulse current to the two magnetic wires;
detect a coil voltage generated in the detection coil of the magnetic field detection element when the pulse current flows in the two magnetic wires;
convert the coil voltage into an electric signal proportional to the magnitude of an external magnetic field H.

7. The method of fabricating a magnetic sensor of claim 6, wherein the two magnetic wires have conductivity and an anisotropic magnetic field of 20 Giga (G) or smaller.

8. The method of fabricating a magnetic sensor of claim 6, wherein the detection coil has a coil pitch of 10 micro meter (μm) or smaller.

9. The method of fabricating a magnetic sensor of claim 6, wherein the substrate film has a thickness in the range of 1 micro meter (μm) to 20 micro meter (μm).

10. The method of fabricating a magnetic sensor of claim 6, wherein the substrate film is a SiN (silicon nitride) film having the thickness in the range of 1 micro meter (μm) to 10 micro meter (μm).

11. The method of fabricating a magnetic sensor of claim 6, wherein the insulating protective film is a SiOz (silicon dioxide) film having a thickness in the range of 0.5 micro meter (μm) to 2 micro meter (μm).

12. A magnetic sensor comprising: an application specific integrated circuit (ASIC), wherein the ASIC comprises circuitry configured to: generate a pulse current; detect a coil voltage; convert the coil voltage into an electric signal proportional to the magnitude of an external magnetic field H; an insulating protective film formed on a surface of the ASIC; a substrate film formed on the insulating protective film, the substrate film having a groove formed on a surface; two magnetic wires arranged at least partially embedded in the groove formed on the substrate film; a detection coil surrounding the two magnetic wires; two electrodes coupled to the two magnetic wires for wire energization electrically coupled to the circuitry configured to generate a pulse current; two electrodes coupled to the coil for coil voltage detection electrically coupled to the circuitry configured to detect a coil voltage; and wherein the two electrodes coupled to the two magnetic wires and two electrodes coupled to the coil are electrically connected to associated element coupling electrodes of the ASIC by through-hole type connections through the substrate film and the insulating protective film;

wherein the two magnetic wires have a two-phase magnetic domain structure of a surface magnetic domain having spin alignment in a circumferential direction, and a central core magnetic domain having spin alignment in an axial direction.

13. The magnetic sensor of claim 12, wherein the two magnetic wires have conductivity and an anisotropic magnetic field of 20 Giga (G) or smaller.

14. The magnetic sensor of claim 12, wherein the detection coil has a coil pitch of 10 micro meter (μm) or smaller.

* * * * *